March 3, 1964 L. D. THOMAS 3,123,777
APPLICATION OF A.G.C. TO GROUNDED GRID AMPLIFIER
Filed Jan. 24, 1962
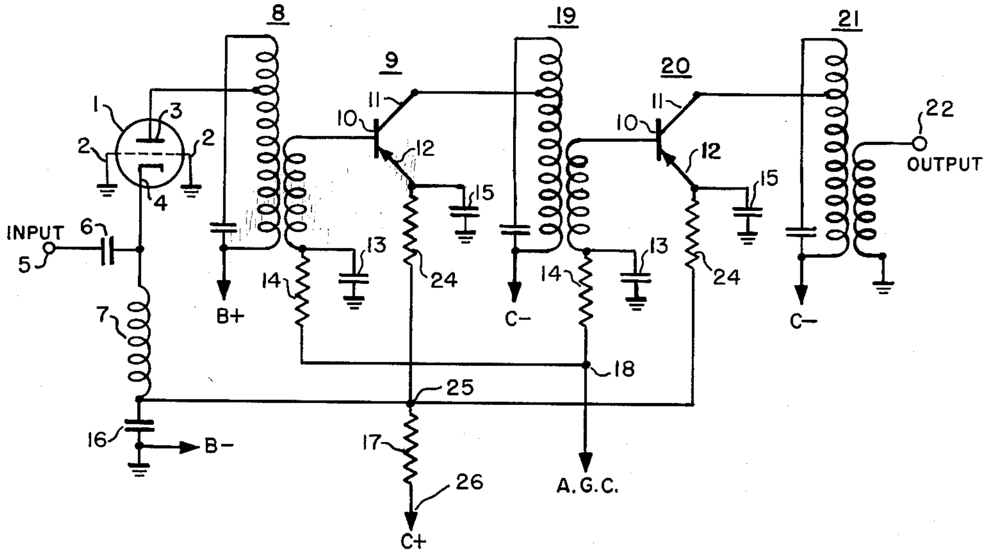
INVENTOR,
LESLIE D. THOMAS.
BY Jack H. Linscott
ATTORNEY.

United States Patent Office 3,123,777
Patented Mar. 3, 1964

3,123,777

APPLICATION OF A.G.C. TO GROUNDED GRID AMPLIFIER

Leslie D. Thomas, Baltimore, Md., assignor, by mesne assignments, to the United States of America as represented by the Secretary of the Army Filed Jan. 24, 1962, Ser. No. 168,564
6 Claims. (Cl. 330—3)

This invention relates to automatic gain control circuits, and particularly to the application of automatic gain control to grounded-grid amplifier stages.

In ultra-high frequency circuits it is frequently desirable to use grounded-grid vacuum tube amplifiers in the input stages to achieve a favorable signal-to-noise ratio; or for other considerations, where, for example, semiconductor devices or other vacuum-tube circuits may be less suitable for various reasons. Because automatic gain-control circuits are usually high impedance systems the conventional approach for controlling the gain of a grounded-grid amplifier is to take advantage of the relatively high impedance of the grid circuit by applying the gain control voltage thereto. However, this arrangement has certain inherent drawbacks which the present invention overcomes.

This invention takes advantage of the relatively high current capabilities of transistors for controlling the cathode voltage of the grounded grid amplifier stage to permit direct and effective R.F. grounding of the grid circuit of the amplifier. This is accomplished by coupling one or more transistors into the cathode circuit to control its voltage, permitting the grid of the tube to be "solidly" grounded in the most direct manner feasible.

It is therefore an object of the present invention to provide a novel gain control circuit for grounded-grid amplifier stages.

It is a further object of this invention to provide an automatic gain control system for grounded-grid amplifiers where gain control is effected by one or more transistors.

It is an additional object of the invention to provide a gain control circuit for grounded-grid amplifiers wherein the cathode voltage of the amplifier is controlled by a transistor coupled to the cathode circuit.

It is a further object of this invention to utilize transistor amplifier stages controlled by an automatic gain control system to control the gain of one or more grounded-grid amplifier stages.

In order for a grounded-grid amplifier to achieve its best performance it is essential that the grid be "solidly" grounded by the most direct means to reduce the impedance of this portion of the circuit to a minimum.

Conventional automatic gain control circuits are generally of high impedance. Because the grid circuits of vacuum tube amplifiers are of relatively high impedance, the usual approach is to apply A.G.C. voltage to the grid of the R.F. amplifier. However, problems arise if this is done with a grounded-grid amplifier operating in the very high frequency ranges.

Applying automatic gain control voltage to the grid circuit of the grounded-grid amplifier necessitates the use of one or more R.F. bypass capacitors at the grid contact. These capacitors, by their physical size, introduce some impedance into the grid circuit. Any impedance at this point, however small, is usually undesirable, especially as the tube approaches its upper limit of operation. The inductive and capacitive components of this impedance may also create undesirable resonance in the grid circuit.

It is possible with disc-seal tubes, for example, to have a large grid contact area in the form of an annular flange which can be clamped directly to ground. The A.G.C. circuit of this invention permits utilization of a grounded grid amplifier to its best advantage in this manner, and additionally provides a unique arrangement for utilizing cascaded semiconductor amplifiers for the dual function of A.C. and D.C. amplification, as will be set forth more fully below.

A complete description of the invention is set forth in the following specification and annexed drawing in which the single FIGURE is a schematic diagram of the circuit of the invention.

Amplifier tube 1 serves as the first stage of an amplifier system of several stages, two of which are shown as representative. Amplifier 1 may be the first stage of an I.F. amplifier chain, or it may be the R.F. stage in a receiver system where transistors 9 and 20 are successive R.F. stages. For purpose of this invention, stages 9 and 20 may also be I.F. amplifiers if a mixer intervenes between tube 1 and amplifiers 9 and 20.

Amplifier tube 1 has its grid grounded at one or more points 2 to the surrounding structure (not shown) to give a direct R.F. ground path of low impedance. The tube may be a disc-seal type having an annular grid contact ring, or it may be a single-ended type where plural grid contact pins are used to insure a low impedance in the grid to ground path. In any case, the R.F. input 5 is connected to cathode 4 through capacitor 6, and the D.C. cathode circuit is through R.F. choke 7 to isolate the A.C. and D.C. cathode circuits. Output from plate 3 is coupled to base 10 of transistor 9 by means of a transformer 8, for example, although any other suitable means of A.C. coupling may be employed. As previously mentioned, a mixer stage could intervene between tube 1 and transistor 9, if the gain control system were to be used in a superheterodyne receiver, for example.

Transistor stage 9 is typical of the several amplifier stages that may follow tube 1. Automatic gain control voltage from other parts of the receiver system is fed from point 18 to base 10 through resistor 14. Resistor 14 and capacitor 13 serve as a filter network for the A.G.C. voltage. R.F. output from collector 11 is coupled through transformer 19 to the next stage 20, which may have its output connected through transformer 21 to output 22 to similar cascaded stages.

Emitter 12 of transistor 9 is returned to R.-F. ground through capacitor 15, and coupled to point 25 through resistor 24. Emitter 12 is bypassed to ground through capacitor 15. The emitters of stage 20 and succeeding stages (not shown) are similarly coupled to point 25. This point is connected to the lower end of R.F. choke 7 where capacitor 16 provides an A.C. shunt to ground. Junction 25 is connected through resistor 17 to a source of positive voltage for the emitters of transistors 9 and 20, which are of the N type for purposes of illustration. The D.C. circuit for cathode 4 of tube 1 is also completed through resistor 17. The voltage source and the resistance of 17 are so selected as to set the no-signal bias of tube 1 and transistors 9 and 20 at their maximum gain.

An increase in signal strength at input 5 appears at the output 22 where it will cause an increase in A.G.C. voltage at point 18. A conventional rectifier and D.C. filter (not shown) may be used for the purpose. This A.G.C. voltage is applied simultaneously to all the transistor bases 10 through resistors 14. As each of the bases goes positive the emitter currents are reduced and, because the emitters are connected in common through resistor 17 to positive source 26, the emitters also become more positive. This change in voltage also causes the cathode of tube 1 to go more positive with respect to the grid, thus automatically controlling the gain of tube 1 along with the gain of transistors 9 and 20.

It can thus be seen that transistors 9 and 20 provide the dual functions of amplifying the A.C. signal through the successive stages, and of providing a power gain for the A.G.C. system to enable it to control the cathode voltage of the grounded-grid amplifier. By this means the direct grounding of the amplifier grid is possible, so avoiding the use of grid by-pass capacitors with their attendant impedance and undesired resonance problems. It is to be particularly noted that no separate nor additional A.G.C. amplifier stages are required to achieve this objective; and for that matter, few if any other components are required, beyond those essential to any conventional A.G.C.-controlled amplifier system of an equal number of stages. This simplicity of the circuit insures a minimum cost of production, and a high reliability factor.

This system may be used to control more than one grounded-grid, or other, stages. The stages from which the amplified gain control voltage is taken can be utilized in other A.C. amplification circuits than those shown, provided they can be coupled in parallel for the D.C. current requirements of the A.G.C. line. Type "P" transistors may be utilized in suitable circuits. It is obvious that many changes and modifications are possible in the circuit disclosed, and the invention is not limited to the precise details nor operation set forth, except as defined in the following claims.

I claim:

1. A gain-control circuit for a high-frequency amplifier; said amplifier comprising: a first amplifying device having a cathode, a grid, and an anode, said grid being grounded; a second amplifying device having an input electrode, an output electrode, and a third electrode; means to apply an input signal to said cathode; a source of gain-control voltage; means to couple said gain-control source to said input electrode; means to couple said anode to said input electrode; a source of D.C. potential; means to couple said third electrode and said cathode to said D.C. potential source; and means for obtaining an output signal from said output electrode.

2. A gain-control circuit defined in claim 1 wherein said second amplifying device is a transistor.

3. The gain-control defined in claim 2 wherein said input electrode is the base electrode of said transistor, said output electrode is the collector electrode of said transistor and said third electrode is the emitter electrode of said transistor.

4. A gain-control circuit for a high frequency amplifier, said amplifier comprising: an electron tube having a cathode, a grid and an anode, said grid being connected directly to ground; means to apply an input signal to said cathode; a transistor having a base, a collector, and an emitter; means coupled to said collector for obtaining an output signal; a source of gain-control voltage; means to couple said gain-control source to said base; a source of D.C. potential; resistive means to couple said source of D.C. potential to said emitter; means to couple said anode to said base; and inductive means to couple said source of D.C. potential to said cathode.

5. A gain-control circuit for a high frequency amplifier, said amplifier comprising: an electron tube having a cathode, a grid and an anode, said grid being connected directly to ground; an amplifier chain having a plurality of cascaded transistors, said transistors each having a base, a collector and an emitter; means to couple the base of the first transistor of said amplifier chain to said anode; means coupled to the collector of the last transistor of said amplifier chain for obtaining an output signal; a source of D.C. potential; means for coupling said D.C. potential to the emitter of each of said plurality of transistors; inductive means to couple said D.C. potential to said cathode; a source of gain-control voltage; means to couple said gain-control voltage to the base of each of said plurality of transistors; and means to apply an input signal to said cathode.

6. A gain-control circuit for a high frequency amplifier, said amplifier comprising: an electron tube having a cathode, a grid and an anode; means for coupling an input signal to said cathode; means for connecting said grid directly to ground; a first transistor having a base, a collector and an emitter; first transformer means for coupling said anode to said base of said first transistor; a second transistor having a base, a collector and an emitter; second transformer means for coupling the collector of said first transistor to the base of said second transistor; third transformer means coupled to the collector of said second transistor; a source of gain-control voltage; a first resistor for coupling said gain-control voltage to the base of said first transistor; a second resistor for coupling said gain-control voltage to the base of said second transistor; a source of D.C. potential; a common point; a third resistor connected between said source of D.C. potential and said common point; a fourth resistor connected between said common point and the emitter of said first transistor; a fifth resistor connected between said common point and the emitter of said second transistor; and an inductance coil connected between said common point and said cathode.

References Cited in the file of this patent

UNITED STATES PATENTS

| | | |
|---|---|---|
| 2,739,189 | Kock | Mar. 20, 1956 |
| 3,036,276 | Brown | May 22, 1962 |

FOREIGN PATENTS

| | | |
|---|---|---|
| 567,461 | Canada | Dec. 16, 1958 |